United States Patent
Jang (10) Patent No.: US 9,338,934 B2
(45) Date of Patent: May 10, 2016

(54) SHIELD-CAN AND JIG FOR MANUFACTURING SHIELD-CAN

(71) Applicant: SAMSUNG ELECTRO-MECHANICS CO., LTD., Suwon (KR)

(72) Inventor: Jin Bok Jang, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 320 days.

(21) Appl. No.: 13/800,288

(22) Filed: Mar. 13, 2013

(65) Prior Publication Data

US 2014/0182925 A1  Jul. 3, 2014

(30) Foreign Application Priority Data

Dec. 28, 2012  (KR) .......................... 10-2012-0155966

(51) Int. Cl.
| | | |
|---|---|---|
| H05K 9/00 | (2006.01) | |
| H05K 13/00 | (2006.01) | |
| B23B 5/14 | (2006.01) | |
| H04M 1/02 | (2006.01) | |

(52) U.S. Cl.
CPC .......... *H05K 13/0023* (2013.01); *H05K 9/0026* (2013.01); *H04M 1/0264* (2013.01)

(58) Field of Classification Search
CPC .................................. H05K 9/00; H05K 13/00
USPC .......................................... 174/382; 269/287
See application file for complete search history.

(56) References Cited

U.S. PATENT DOCUMENTS

| | | | | |
|---|---|---|---|---|
| 5,398,264 A | * | 3/1995 | Anderson | G21C 3/3424 219/158 |
| 5,406,599 A | * | 4/1995 | Johnson, Jr. | G21C 3/3424 219/158 |
| 5,957,293 A | * | 9/1999 | Pakeriasamy | H01L 21/67333 206/565 |
| 6,227,372 B1 | * | 5/2001 | Thomas | H01L 21/67336 206/454 |
| 6,322,598 B1 | * | 11/2001 | Meuris | H01L 21/67011 118/641 |
| 6,776,887 B2 | * | 8/2004 | Roberts | C23C 14/50 118/501 |
| 6,909,177 B2 | * | 6/2005 | Kang | H01L 21/67333 257/710 |
| 6,977,783 B2 | * | 12/2005 | Lung | G02B 7/02 250/208.1 |
| 7,074,638 B2 | * | 7/2006 | Maeda | H01L 27/14618 257/E27.15 |

(Continued)

FOREIGN PATENT DOCUMENTS

| KR | 10-2009-0058032 | 6/2009 |
|---|---|---|
| KR | 10-2012-0021085 | 3/2012 |

OTHER PUBLICATIONS

Korean Office Action mailed Jan. 21, 2014 in corresponding Korean Application No. 10-2012-0155966.

*Primary Examiner* — Courtney Smith
*Assistant Examiner* — Rashen E Morrison
(74) *Attorney, Agent, or Firm* — NSIP Law (57) ABSTRACT

There is provided a shield-can, including a plate including a circular through-hole formed therein for exposing a lens part, a plurality of side walls extended from edges of the plate and forming an inner space together with the plate, an anti-reflection layer stacked on an upper surface of the plate, and an insulating layer stacked on an inner surface of any one side wall of the plurality of side walls and at edges of inner surfaces of side walls neighboring the any one side wall, wherein the insulating layer has a band shape and is stacked on lower end portions of the inner surfaces of the side walls.

2 Claims, 6 Drawing Sheets

(56) References Cited

U.S. PATENT DOCUMENTS

| | | | | |
|---|---|---|---|---|
| 7,187,501 B2* | 3/2007 | Wakisaka | G02B 3/0031 | 359/622 |
| 7,261,599 B2* | 8/2007 | Li | H01R 13/6275 | 439/607.01 |
| 7,288,003 B2* | 10/2007 | Ono | H01R 12/7076 | 439/607.01 |
| 7,435,139 B2* | 10/2008 | Yang | H01R 13/2442 | 439/607.01 |
| 7,450,834 B2* | 11/2008 | Makii | G02B 7/026 | 367/165 |
| 7,505,215 B2* | 3/2009 | Sanou | H04N 5/2254 | 359/694 |
| 7,564,496 B2* | 7/2009 | Wolterink | G02B 13/006 | 257/432 |
| 7,663,823 B2* | 2/2010 | Chung | G02B 7/08 | 359/824 |
| 7,813,043 B2* | 10/2010 | Lusinchi | G02B 13/001 | 359/619 |
| 7,901,217 B2* | 3/2011 | Asai | H01R 13/2442 | 439/71 |
| 8,013,289 B2* | 9/2011 | Chang | H01L 31/0232 | 250/208.1 |
| 8,015,690 B2* | 9/2011 | Ueno | H04N 5/2252 | 174/386 |
| 8,049,815 B2* | 11/2011 | Huang | G02B 7/021 | 348/374 |
| 8,090,250 B2* | 1/2012 | Lusinchi | G03B 3/00 | 396/439 |
| 8,485,511 B2* | 7/2013 | Di Stefano | H01L 21/67333 | 269/303 |
| 8,628,069 B2* | 1/2014 | Lee | G01R 31/2893 | 269/136 |
| 8,642,119 B2* | 2/2014 | Wong | B05D 1/325 | 348/294 |
| 8,654,177 B2* | 2/2014 | Kim | H04N 5/2252 | 348/335 |
| 8,720,875 B2* | 5/2014 | Di Stefano | H01L 21/67333 | 206/701 |
| 8,884,247 B2* | 11/2014 | Miller | H01J 37/3023 | 250/307 |
| 2004/0012698 A1* | 1/2004 | Suda | H01L 27/14618 | 348/315 |
| 2006/0035415 A1* | 2/2006 | Wood | H01L 27/14618 | 438/125 |
| 2007/0126912 A1* | 6/2007 | De Bruin | H01L 31/0203 | 348/340 |
| 2008/0259468 A1* | 10/2008 | Chung | | 359/814 |
| 2010/0118182 A1* | 5/2010 | Fujii | G02B 3/0075 | 348/374 |
| 2010/0150545 A1* | 6/2010 | Imai | G02B 7/102 | 396/535 |
| 2010/0165172 A1* | 7/2010 | Kawazu | G02B 5/005 | 348/340 |
| 2010/0321802 A1* | 12/2010 | Kim | B29D 11/00403 | 359/811 |
| 2011/0019077 A1* | 1/2011 | Kobayashi | H01L 31/02325 | 348/374 |
| 2011/0234890 A1* | 9/2011 | Kobayashi | H04N 5/2251 | 348/373 |
| 2011/0261550 A1* | 10/2011 | Wong | H01L 21/561 | 361/818 |
| 2011/0266045 A1* | 11/2011 | Xiong | H05K 9/0032 | 174/350 |
| 2012/0147258 A1* | 6/2012 | Park | G02B 7/08 | 348/374 |
| 2014/0182925 A1* | 7/2014 | Jang | H05K 13/0023 | 174/382 |

* cited by examiner

SHIELD-CAN AND JIG FOR MANUFACTURING SHIELD-CAN

CROSS-REFERENCE TO RELATED APPLICATIONS

This application claims the priority of Korean Patent Application No. 10-2012-0155966 filed on Dec. 28, 2012, in the Korean Intellectual Property Office, the disclosure of which is incorporated herein by reference.

BACKGROUND OF THE INVENTION

1. Field of the Invention

The present invention relates to a shield-can and a jig for manufacturing the shield-can.

2. Description of the Related Art

A case in which a mobile communications terminal such as a mobile phone, a personal digital assistant (PDA), and the like has a camera module mounted therein has more increased.

In addition, the camera module is generally mounted on a printed circuit board, wherein the printed circuit board functions in a state in which various electronic components are mounted thereon, together with the camera module. Meanwhile, the above-mentioned electronic components are generally configured so as to form an integral module on the printed circuit board.

However, the integral module used in a mobile communications terminal and the like may be exposed to severe electro-magnetic interference, and this electro-magnetic interference may cause the electronic components configuring the integral module to function abnormally.

In order to solve the above-mentioned problem, a shield-can of a typical metal is used, where the shield-can forms an exterior of the camera module and serves to block the electro-magnetic interference affecting the electronic components and to protect the camera module from an external impact.

Meanwhile, the above-mentioned shield-can is generally mounted on a printed circuit board on which the electronic components are mounted, such that a protruded portion of a solder for electrically connecting the electronic components and the printed circuit board and the shield-can may be in contact. Therefore, short between the electronic component and the shield-can may be generated by the contact between the protruded portion of the solder and the shield-can.

Further, in the case in which the shield-can is mounted on the camera module, light reflected from an upper surface of the shield-can may interfere with light incident on a lens part of the camera module, such that an amount of the light toward the lens part may be decreased.

RELATED ART DOCUMENT

Korean Patent Laid-Open Publication No. 2010-0085134

SUMMARY OF THE INVENTION

An aspect of the present invention provides a shield-can capable of improving an amount of light incident on a lens part and decreasing occurrance of shorts at the time of being installed in a camera module.

Another aspect of the present invention provides a jig for manufacturing a shield-can, capable of simultaneously forming an insulating layer and an anti-reflection layer on the shield-can.

According to an aspect of the present invention, there is provided a shield-can, including: a plate including a circular through-hole formed therein for exposing a lens part; a plurality of side walls extended from edges of the plate and forming an inner space together with the plate; an anti-reflection layer stacked on an upper surface of the plate; and an insulating layer stacked on an inner surface of any one side wall of the plurality of side walls and at edges of inner surfaces of side walls neighboring the any one side wall, wherein the insulating layer has a band shape and is stacked on lower end portions of the inner surfaces of the side walls.

The plate and the plurality of side walls may be formed integrally with each other and may be formed of a metal material.

The plate may have a quadrangular shape and the plurality of side walls may be configured of first through fourth side walls extended from the plate.

The insulating layer may be entirely stacked on a lower end portion of an inner surface of the first side wall and may only be stacked on a partial region of lower end portions of corners at which the second and third side walls and the first side wall are connected to each other in the second and third side walls.

According to another aspect of the present invention, there is provided a jig for manufacturing a shield-can, the jig including: an upper jig including a plurality of cells formed therein, each of the plurality of cells being provided with an opening part exposing an upper surface of the shield-can; and a lower jig including a plurality of unit cells formed therein, the plurality of unit cells being provided with a shield-can coupling part corresponding to a shape of the shield-can, wherein the shield-can coupling part is provided with an open part allowing an insulating layer to be formed on an inner surface of the shield-can, and the plurality of unit cells are provided with an insulating layer forming prevention jaw protruded to the open part side in order to prevent the insulating layer from being formed on a bottom surface of the shield-can.

The plurality of cells may be provided with a separation preventing jaw extended to the opening part side to thereby prevent the shield-can from being upwardly separated.

Bottom surfaces of the plurality of cells may be provided with supporting wall parts extended in order to support an outer surface of the shield-can.

The plurality of unit cells may be provided with support protrusions in order to support an outer surface of a side wall of the shield-can disposed in the open part.

Bottom surfaces of the plurality of unit cells may be provided with an inclined surface in order to easily form the insulating layer in the shield-can.

The upper jig may include upper and lower side wall parts extended upwardly and downwardly from an edge thereof, the lower jig may include upper and lower extending wall parts extended upwardly and downwardly from an edge thereof, and each of the lower side wall part and the upper extending wall part may be formed so that at least one of four corners thereof has a shape different from that of other corners.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

Figure 1:
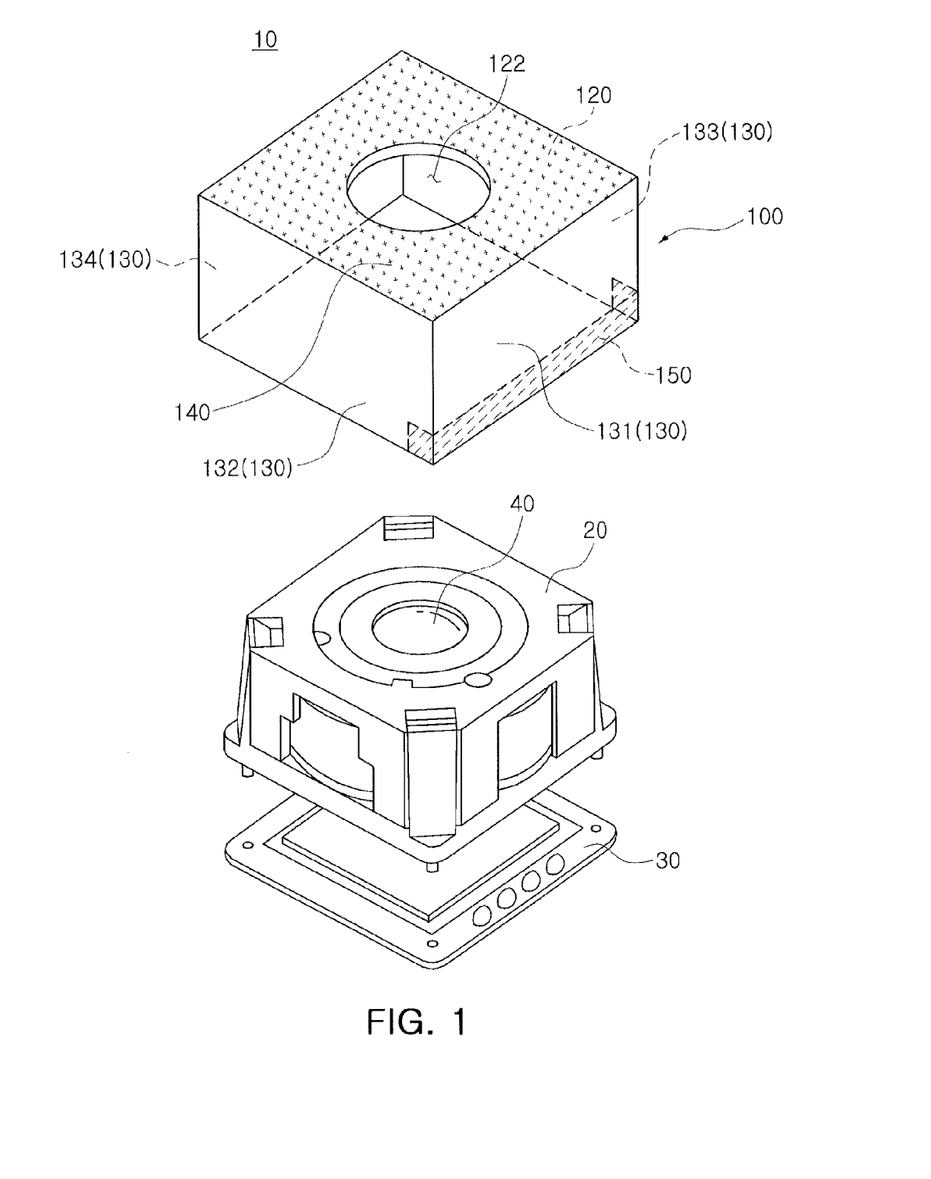
FIG. 1 is an exploded perspective view showing a camera module having a shield-can installed therein according to an embodiment of the present invention.
Figure 2:
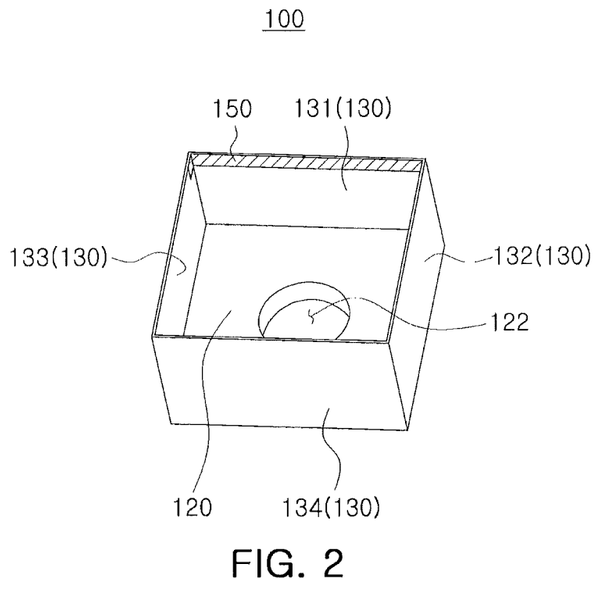
FIG. 2 is a perspective view of the shield-can according to the embodiment of the present invention when viewed from a direction different from that of FIG. 1.

FIG. 1 is an exploded perspective view showing a camera module having a shield-can installed therein according to an embodiment of the present invention and FIG. 2 is a perspective view of the shield-can according to the embodiment of the present invention when viewed from a direction different from that of FIG. 1.

Referring to FIGS. 1 and 2, the shield-can 100 according to the embodiment of the present invention may include a plate 120, side walls 130, an anti-reflection layer 140, and an insulating layer 150, as an example.

Meanwhile, the shield-can 100 according to the embodiment of the present invention may be installed so as to receive a housing 20 of a camera module 10 therein. In addition, the shield-can 100 may be mounted on a circuit substrate 30 of the camera module 10.

The plate 120 may be provided with a through-hole 122 for exposing a lens part 40 installed in the housing 20.

Meanwhile, the through-hole 122 has a shape corresponding to that of the lens part 40 and may be formed so as to have a circular shape as shown in FIGS. 1 and 2. However, the shape of the through-hole 122 is not limited thereto, but may have a polygonal shape.

In addition, the through-hole 122 may be formed so as to have a diameter larger than that of the lens part 40. That is, when the shield-can 100 is coupled to the housing 20 in a state in which the center of the through-hole 122 and the center of the lens part 40 do not coincide with each other, the through-hole 122 may be formed so as to have the diameter larger than that of the lens part 40 in order to prevent a portion of the lens part 40 from being covered by the plate 120.

In addition, the plate 120 may be formed so as to have a quadrangular shape. Further, the shape of the plate 120 is also not limited to the quadrangular shape, but may be variously changed.

The side wall 130 is extended from an edge of the plate 120 and forms an inner space together with the plate 120. In addition, the side wall 130 may be formed in plural.

That is, the side wall 130 may be configured of first, second, third, and fourth side walls 131, 132, 133, and 134 extended from the plate 120 having the quadrangular shape. However, the number of the side walls 130 is not limited to four, but the side wall 130 may be configured of three or five or more side walls according to the shape of the plate 120.

Meanwhile, the side wall 130 may be formed of a metal material, and further, the side wall 130 may be formed integrally with the plate 120. That is, a coupled configuration of the plate 120 and the side wall 130 may be formed in a shape in which a lower portion thereof is opened.

The anti-reflection layer 140 may be stacked on an upper surface of the plate 120. In addition, the anti-reflection layer 140 serves to prevent an amount of light of the lens part 110 from being decreased by incident light reflected from the upper surface of the plate 120 interfering with light incident on the lens part 110.

Meanwhile, the anti-reflection layer 140 may be simultaneously stacked together with the insulating layer 150.

In addition, the anti-reflection layer 140 may be stacked on the upper surface of the plate 120 by any one of, for example, a spray method, a printing method, a dispenser method, a transfer method, and a deposition method.

As an example, the anti-reflection layer 140 may be stacked by the spray method or the deposition method.

As described above, since the anti-reflection layer 140 is formed on the upper surface of the plate 120, a decrease in the amount of the light by the shield-can 100 may be suppressed in the case in which the shield-can 100 is installed in the camera module 10.

The insulating layer 150 may be stacked on an inner surface of any one side wall (as one example, the first side wall 131) of the side walls 130 and at edges of inner surfaces of the side walls (that is, the second and third side walls 132 and 133) neighboring anyone side wall (that is, the first side wall 131).

In addition, the insulating layer 150 may have a band shape and may be stacked on the side walls (that is, the first, second, and third side walls 131, 132, and 133). Further, the insulating layer 150 may be entirely stacked on a lower end portion of the inner surface of the first side wall 131 and may only be stacked on partial regions of lower end portions of corners at which the second and third side walls 132 and 133 and the first side wall 131 are connected to each other in the second and third side walls 132 and 133.

In addition, the insulating layer 150 is not formed on a bottom surface of the first side wall 131. Therefore, an electrical connection between the shield-can 100 and the circuit substrate 30 may be easily performed. That is, the shield-can 100 and the circuit substrate 30 is generally configured so as to be electrically connected to each other, where in the case in which the insulating layer 150 is formed on the bottom surface of the first side wall 131, the electrical connection between the shield-can 100 and the circuit substrate 30 may not be performed.

That is, the shield-can 100 and the circuit substrate 30 is electrically connected to each other by applying a conductive adhesive, but in the case in which a crack is generated in the adhesive according to an environment, the bottom surface of the side wall 130 contacts the circuit substrate 30, such that the shield-can 100 and the circuit substrate 30 may be electrically connected to each other.

However, in the case in which the insulating layer 150 is formed on the bottom surface of the first side wall 131, the possibility of electrical connectivity between the shield-can 100 and the circuit substrate 30 may be relatively low.

Therefore, since the insulating layer 150 may not be formed on the bottom surface of the side wall 130, electrical connectivity between the shield-can 100 and the circuit substrate 30 may be improved.

In addition, the insulating layer 150 is stacked so as to be extended to partial regions of the second and third side walls 132 and 133. Therefore, the occurrence of shorts may further be decreased. In the case in which the circuit substrate 30 is disposed so as to be bent or twisted, a protrusion part of a solder for a connection between the circuit substrate 30 and an electronic component may contact a corner side formed by the second and third side walls 132 and 133 and the first side wall 131.

However, since the insulating layer 150 is stacked so as to be extended to the partial regions of the second and third side walls 132 and 133 as described above, the occurrence of shorts may further be decreased.

Meanwhile, since the insulating layer 150 is also simultaneously stacked at the time of laminating the anti-reflection layer 140, the insulating layer 150 may be stacked on the side wall 130 by any one of, for example, a spray method, a printing method, a dispenser method, a transfer method, and a deposition method.

As an example, the insulating layer 150 may be stacked by the spray method or the deposition method.

As described above, the yield of the light toward the lens part 40 may be improved by decreasing the reflection of the incident light by the anti-reflection layer 140, and the short generated in the case of being installed at the camera module 10 may also be decreased by the insulating layer 150 formed only on the inner surface of the side wall 130.

Further, since the insulating layer 150 is stacked so as to be extended to the partial regions of the second and third side walls 132 and 133 while being stacked on the first side wall 131, the occurrence of shorts may further be decreased.

Hereinafter, a jig for manufacturing a shield-can according to an embodiment of the present invention will be described with reference to the drawings.

Figure 3:
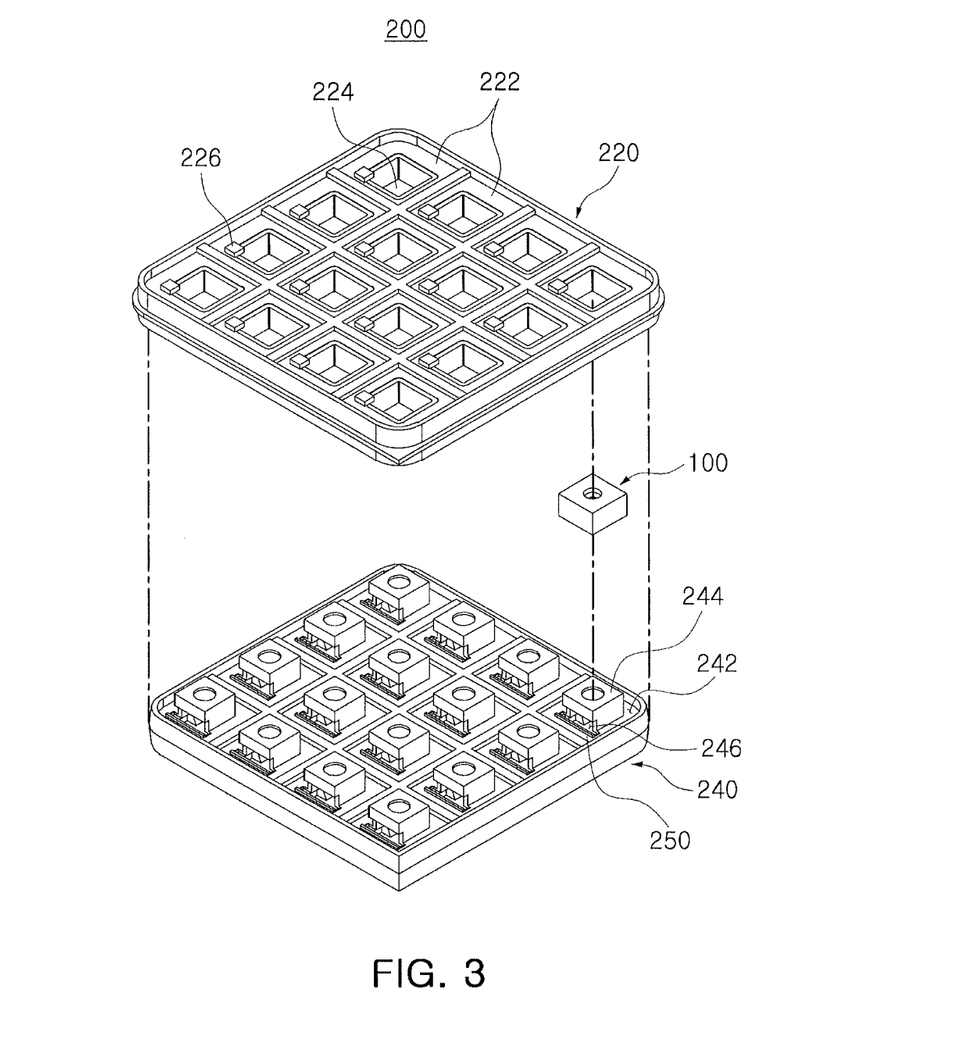
FIG. 3 is an exploded perspective view showing a jig for manufacturing a shield-can according to an embodiment of the present invention.
Figure 4:
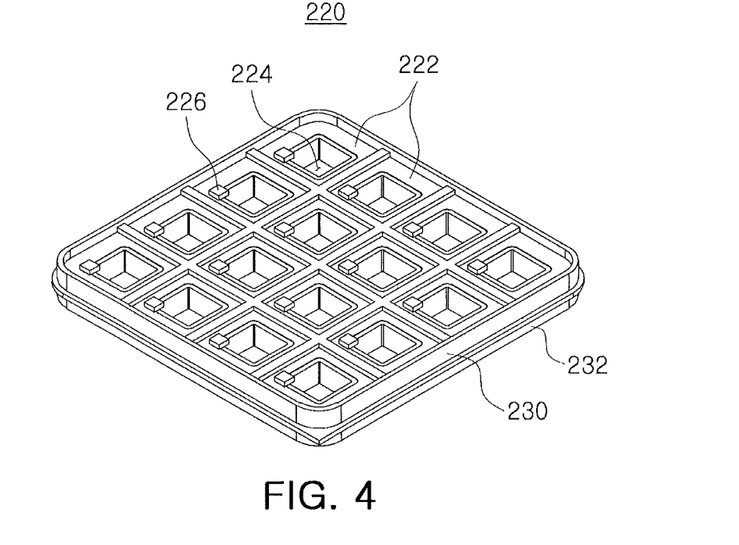
FIG. 4 is a perspective view showing an upper jig included in the jig for manufacturing the shield-can according to the embodiment of the present invention.
Figure 5:
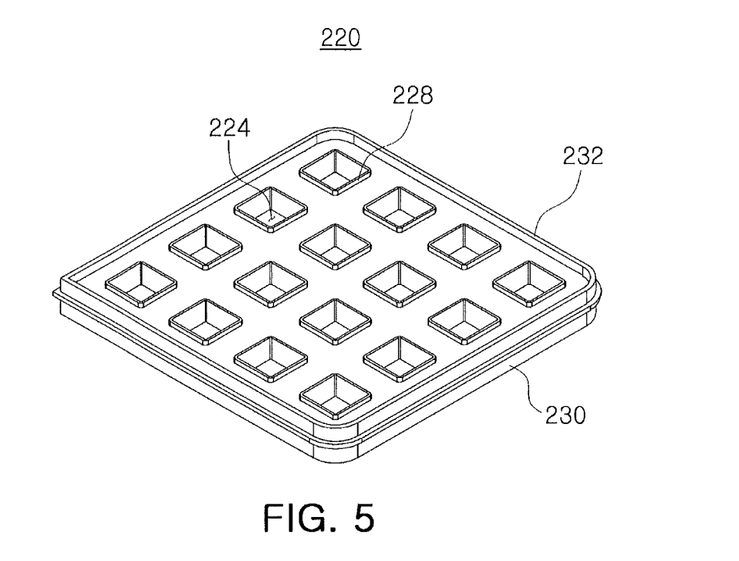
FIG. 5 is a perspective view showing the upper jig included in the jig for manufacturing the shield-can according to the embodiment of the present invention when viewed from a direction different from that of FIG. 4.
Figure 6:
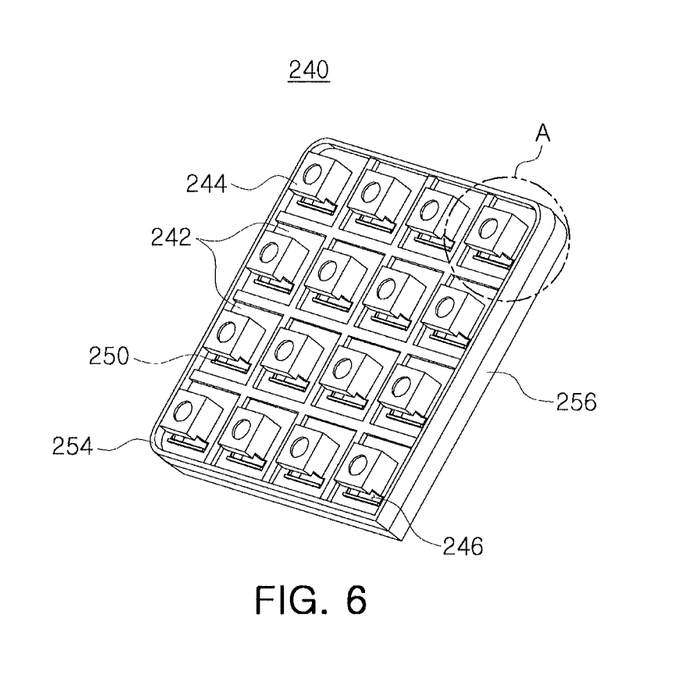
FIG. 6 is a perspective view showing a lower jig included in the jig for manufacturing the shield-can according to the embodiment of the present invention.
Figure 7:
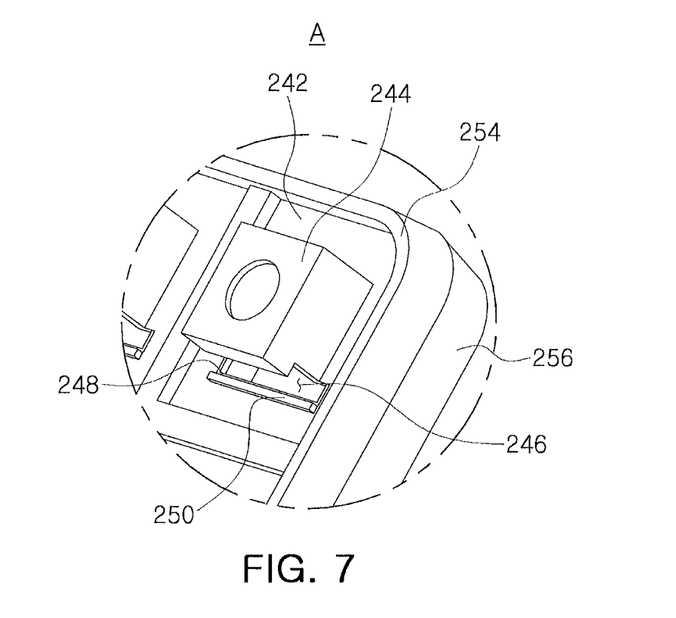
FIG. 7 is an enlarged view of the part A of FIG. 6.
Figure 8:
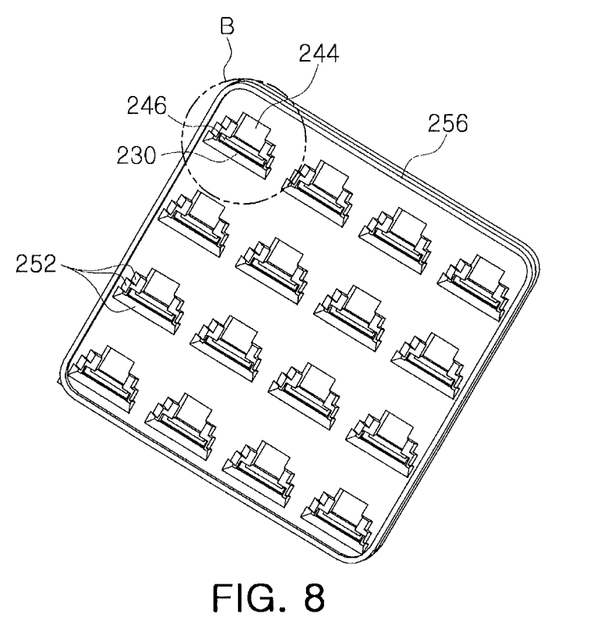
FIG. 8 is a perspective view showing the lower jig included in the jig for manufacturing the shield-can according to the embodiment of the present invention when viewed from a direction different from that of FIG. 6.
Figure 9:
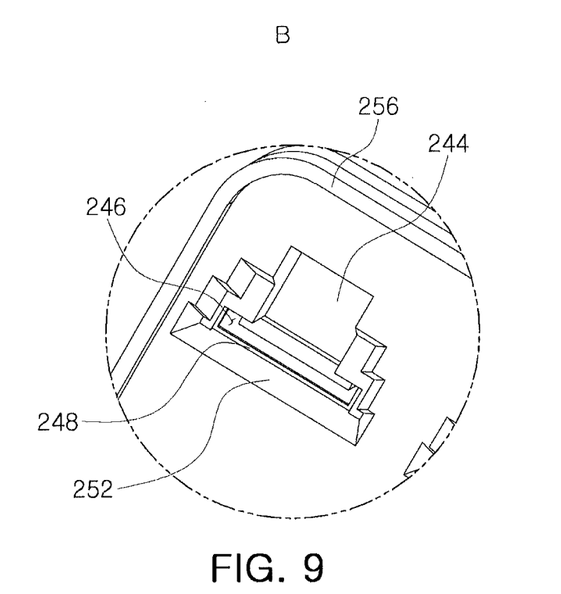
FIG. 9 is an enlarged view showing part B of FIG. 8.

FIG. 3 is an exploded perspective view showing a jig for manufacturing a shield-can according to an embodiment of the present invention, FIG. 4 is a perspective view showing an upper jig included in the jig for manufacturing the shield-can according to the embodiment of the present invention, FIG. 5 is a perspective view showing the upper jig included in the jig for manufacturing the shield-can according to the embodiment of the present invention when viewed from a direction different from that of FIG. 4, FIG. 6 is a perspective view showing a lower jig included in the jig for manufacturing the shield-can according to the embodiment of the present invention, FIG. 7 is an enlarged view of the part A of FIG. 6, FIG. 8 is a perspective view showing the lower jig included in the jig for manufacturing the shield-can according to the embodiment of the present invention when viewed from a direction different from that of FIG. 6, and FIG. 9 is an enlarged view showing part B of FIG. 8.

Referring to FIGS. 3 through 9, a jig 200 for manufacturing a shield-can according to an embodiment of the present invention may include an upper jig 220 and a lower jig 240, as an example.

The upper jig 220 may be provided with a plurality of cells 222 and each of the plurality of cells 222 may be provided with an opening part 224 exposing the upper surface of the shield-can 100. The opening part 224 may have a quadrangular shape so as to correspond to the shape of the shield-can 100.

As described above, since the upper jig 220 is provided with the opening part 224, the anti-reflection layer 140 (see FIG. 2) may be formed on the upper surface of the shield-can 100, that is, the plate 120 (see FIG. 2) of the shield-can 100.

In addition, each of the plurality of cells 222 may be provided with a separation preventing jaw 226 extended to the opening part 224 side to thereby prevent the shield-can 100 from being upwardly separated.

That is, the shield-can 100 is coupled toward an upper portion of the upper jig 220 from a lower portion of the upper jig 220, and the upper surface of the shield-can 100 may then be supported by the separation preventing jaw 226 to thereby prevent the shield-can 100 from being separated from the opening part 224.

Meanwhile, although the present embodiment describes a case in which the separation preventing jaw 226 is formed so as to be disposed at any one of corners of the opening part 224 by way of example, a position of forming the separation preventing jaw 226 is not limited thereto.

In addition, bottom surfaces of the plurality of cells 222 may be provided with supporting wall parts 228 extended in order to support an outer surface of the shield-can 100, as shown in FIG. 5. That is, the supporting wall part 228 supports the outer surface of the shield-can 100 so as to dispose the shield-can 100 at a predetermined position. To this end, the supporting wall part 228 may also be formed in a shape corresponding to that of the shield-can 100. In other words, the supporting wall part 228 may be formed so as to have a frame shape.

In addition, the upper jig 220 may include upper and lower side wall parts 230 and 232 extended upwardly and downwardly from an edge.

Meanwhile, the lower side wall part 232 may be formed so that at least one of four corners thereof has a shape different from that of other corners, whereby the upper and lower jigs 220 and 240 may be coupled to each other in a predetermined direction when coupling the upper and lower jigs 220 and 240 to each other.

That is, the lower side wall part 232 may have the frame shape. In addition, as shown in FIG. 5, three corners of four corners of the lower side wall part 232 are formed so as to be rounded and the remaining one corner may be formed at a right angle.

Therefore, when coupling the upper and lower jigs 220 and 240 to each other, the upper and lower jigs 220 and 240 may be coupled to each other in a predetermined direction. The detailed description thereof will be provided below.

The lower jig 240 may be provided with a plurality of unit cells 242, and each of the plurality of unit cells 242 may be provided with a shield-can coupling part 244 corresponding to the shape of the shield-can 100.

Meanwhile, the shield-can coupling part 244 is protruded upwardly from the unit cell 242 and is insertedly disposed in an inner space of the shield-can 100 when being coupled to the shield-can 100. To this end, appearance of the shield-can coupling part 244 may have a shape similar to that of the housing 20 (see FIG. 1) included in the camera module 10 (see FIG. 1).

In addition, the shield-can coupling part 244 may be provided with an open part 246 allowing the insulating layer to be formed on an inner surface of the shield-can 100. That is, the open part 246 may be formed in the shield-can coupling part 244 so as to expose the inner surface of the shield-can 100 to the outside of the lower jig 240.

More specifically, as shown in FIG. 2, the open part 246 is formed in the shield-can coupling part 244 so that the insulating layer 150 (see FIG. 2) may be formed on the inner surface of the side wall 130 (FIG. 2) of the shield-can 100. Therefore, the lower end portion of the first side wall 131 (FIG. 2) and the partial regions of the lower end portions of the second and third side walls 132 and 133 (see FIG. 2) neighboring the first side wall 131 configuring the above-mentioned side wall 130 may be exposed to the outside of the lower jig 240.

Meanwhile, the open part 246 is formed at the lower end portion of the shield-can coupling part 244 as more specifically shown in FIG. 7, and may have a shape in which the lower end portion of the first side wall 131 and the partial regions of the lower end portions of the second and third side walls 132 and 133 are exposed.

In addition, the plurality of unit cells 242 may be provided with an insulating layer forming prevention jaw 248 protruded to the open part 246 side in order to prevent the insulating layer 150 from being formed on the bottom surface of the shield-can 100, as more specifically shown in FIG. 9.

That is, the insulating layer forming prevention jaw 248 serves to prevent the bottom surface of the first side wall 131 and the partial regions of the bottom surfaces of the second and third side walls 132 and 133 from being exposed from the lower jig 240 to thereby prevent the insulating layer 150 from being formed on the bottom of the first side wall 131 and the bottom surfaces of the second and third side walls 132 and 133.

To this end, the insulating layer forming prevention jaw 248 may be extended toward the open part 246 side from the unit cell 242. Therefore, in the case in which the shield-can 100 is coupled to the lower jig 240, an upper surface of the insulating layer forming prevention jaw 248 contacts the bottom surface of the first side wall 131 and the partial regions of the bottom surfaces of the second and third side walls 132 and 133. Therefore, the bottom of the first side wall 131 and the partial regions of the bottom surfaces of the second and third side walls 132 and 133 may not be exposed to the outside.

In addition, each of the plurality of unit cells 242 may be provided with a supporting protrusion 250 in order to support the outer surface of the side wall 130 of the shield-can 100 disposed in the open part 246, as more specifically shown in FIG. 7. That is, in the case in which the shield-can 100 is coupled to the shield-can coupling part 244 of the lower jig 240, the lower end portion of the outer surface of the first side wall 131 is supported by the supporting protrusion 250, such that the shield-can 100 may be maintained at a predetermined position.

Meanwhile, bottom surfaces of the plurality of unit cells 242 may be provided with inclined surfaces 252 in order to easily form the insulating layer 150 in the shield-can 100, as shown in FIG. 9. In addition, the inclined surface 252 is inclined toward the open part 246 side to thereby serve to easily introduce particles configuring the insulating layer 150 into the open part 246 in the case in which the insulating layer 150 is formed by the spray method or the deposition method.

In addition, the lower jig 240 may include upper and lower extending wall parts 254 and 256 extended upwardly and downwardly from an edge.

Meanwhile, the upper extending wall part 254 may be formed so that at least one of four corners thereof has a shape different from that of other corners.

That is, the upper extending wall part 254 may have a frame shape, three corners of four corners thereof are formed so as to be rounded and the remaining one corner may be formed at a right angle.

Therefore, when coupling the upper and lower jigs 220 and 240 to each other, the upper and lower jigs 220 and 240 may be coupled to each other in a predetermined direction.

Meanwhile, the outer surface of the upper extending wall part 254 contacts an inner peripheral surface of the lower side wall part 232 when coupling the upper and lower jigs 220 and 240 to each other. In other words, the upper extending wall part 254 may be insertedly disposed in the lower side wall part 232 when coupling the upper and lower jigs 220 and 240 to each other.

Therefore, it may be prevented that the particle configuring the insulating layer 150 and the anti-reflection layer 140 is introduced into a space formed by the upper and lower jigs 220 and 240 when coupling the upper and lower jigs 220 and 240 to each other.

Therefore, the insulating layer 150 and the anti-reflection layer 140 may be formed in the shield-can 100 only by the opening part 224 of the upper jig 220 and the open part 246 of the lower jig 240.

As described above, since the shield-can 100 is mounted on the upper and lower jigs 220 and 240 and the anti-reflection layer 140 and the insulating layer 150 are simultaneously then formed, the manufacturing yield may be improved.

In addition, it may be prevented that the insulating layer 150 is formed on the bottom surface of the shield-can 100 by the insulating layer forming prevention jaw 248 protruded to the open part 246 side of the lower jig 240.

As set forth above, according to the embodiments of the present invention, reflection of light incident through an anti-reflection layer is decreased, whereby an amount of the light toward a lens part may be improved.

In addition, occurrance of shorts at the time of being installed at a camera module may be decreased by an insulating layer formed only on an inner surface of a shield-can, and the insulating layer may not be formed on a bottom surface of the shield-can such that an electrical connection between a circuit substrate and the shield-can may be easily performed.

In addition, an anti-reflection layer and an insulating layer may be simultaneously formed on the shield-can by an opening part and an open part formed in the upper and lower jigs, whereby a manufacturing yield may be improved.

Further, the insulating layer may not be formed on a bottom surface of the shield-can by an insulating layer forming prevention jaw.

While the present invention has been shown and described in connection with the embodiments, it will be apparent to those skilled in the art that modifications and variations can be made without departing from the spirit and scope of the invention as defined by the appended claims.

What is claimed is:

1. A shield-can, comprising:
 a plate including a circular through-hole formed therein for exposing a lens part;
 a plurality of side walls extended from edges of the plate and forming an inner space together with the plate;
 an anti-reflection layer stacked on an upper surface of the plate; and
 an electrical insulating layer stacked on an inner surface of any one side wall of the plurality of side walls and at edges of inner surfaces of side walls neighboring the any one side wall, wherein the electrical insulating layer has a band shape and is stacked on lower end portions of the inner surfaces of the side walls so as to prevent the plurality of side walls from contacting a protrusion portion of a solder formed on a substrate, wherein the plate has a quadrangular shape and the plurality of side walls are configured of first through fourth side walls extended from the plate, and wherein the electrical insulating layer is entirely stacked on a lower end portion of an inner surface of the first side wall and is only stacked on a partial region of lower end portions of corners at which the second and third side walls and the first side wall are connected to each other in the second and third side walls.

2. The shield-can of claim 1, wherein the plate and the plurality of side walls are formed integrally with each other and are formed of a metal material.

\* \* \* \* \*